Dec. 2, 1958 O. SCHMIDT ET AL 2,863,043
PUSH BUTTON RADIO TUNING MECHANISM WITH
BAND SWITCHING CONTACTS
Filed March 18, 1954
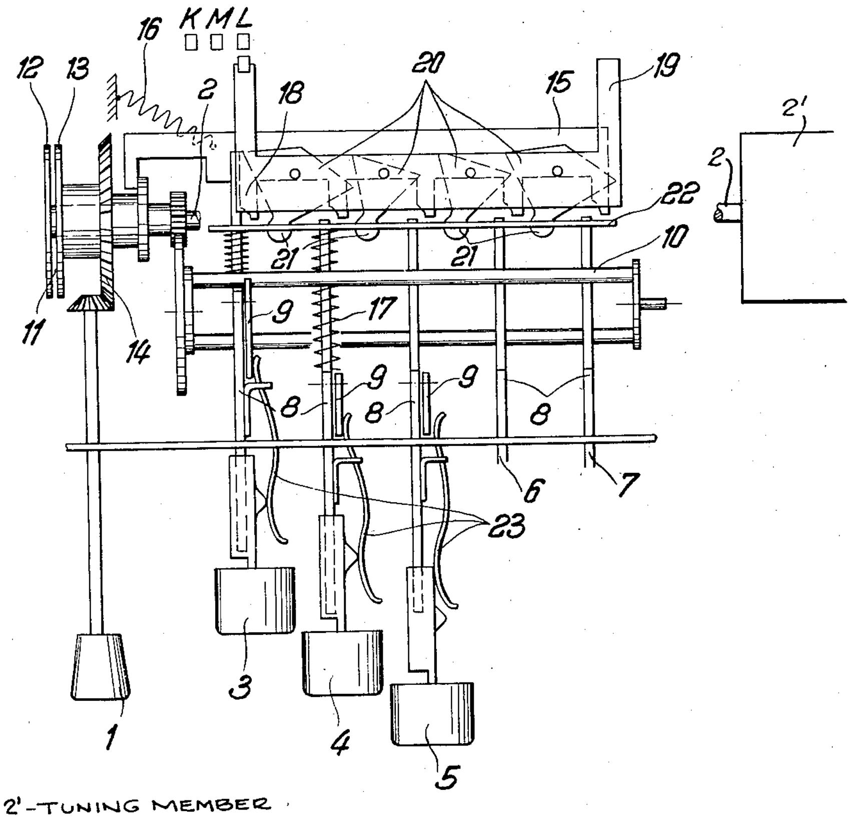
2'-TUNING MEMBER
2-SHAFT OF TUNING MEMBER
11-CLUTCH
15-CLUTCH DISENGAGING LEVER
18-CAM OF CLUTCH DISENGAGING LEVER
19-MOVABLE FRAME
20-CAM SEGMENTS
KML-BAND SWITCHING CONTACTS
*Inventor:*

United States Patent Office 2,863,043 Patented Dec. 2, 1958

2,863,043

PUSH BUTTON RADIO TUNING MECHANISM WITH BAND SWITCHING CONTACTS

Ommo Schmidt, Josef Thrien, and Rudolf Klimke, Hildesheim, Germany, assignors to Blaupunkt-Werke Gesellschaft mit beschränkter Haftung, Hildesheim, Germany Application March 18, 1954, Serial No. 417,152

Claims priority, application Germany April 23, 1953

1 Claim. (Cl. 250—20)

The invention relates to radio frequency transmitters or receivers, particularly to receivers for automobiles with several wave ranges to be tuned by a continuous or push-button tuner as desired.

It has been suggested heretofore to use tuning structures of the push-button type in radio receivers in which either a continuous tuning or a tuning to preselected frequencies shall be effected at will by means of a number of push-buttons or keys. The selection of the fixed frequencies is normally effected by means of an operating disc coupled to the push-button which disc actuates a kind of tilting member for changing the tuning of the tuning circuits. It is also known to provide a clutch between the knob for the continuous tuning and the tuning structure, which clutch disengages the tuning knob for the continuous tuning from the tuning structure when a push-button or key is pressed.

It is an object of the present invention to improve the tuning structures of this type.

It is a further object to provide a tuning structure of this type which is adapted to be used in combination with radio receivers having a number of wave ranges so that simultaneously with the selection of the desired station the wave range switch is actuated.

It is a further object of the invention to provide a radio transmitter or receiver of this type in which in the normal position of operation the rotatable tuning knob for the continuous tuning is always coupled with the tuning member and in which by pressing one of the tuning buttons or keys the rotatable tuning knob is disengaged from the tuning member and the tuning member is brought suddenly into a position determined by a positioning member coupled to the respective key while at the same time the wave range corresponding to the respective key is selected.

It is a further object to provide a tuning structure in which a movement of the keys or buttons in one direction only is sufficient to select a desired station, to set the key to a new station and to select the desired wave range.

Still other objects and advantages will be apparent from the following description of an embodiment represented in the accompanying drawing showing a plan view of a tuning structure of the invention.

The embodiment represented in the figure has a rotatable tuning knob 1 for the continuous tuning of the tuning member 2' which may be a variable capacitor or a variable inductance for instance a coil tunable by a ferromagnetic core, which member is rigidly connected to the shaft 2. The structure is provided furthermore with five push-buttons 3, 4, 5, 6 and 7 for selecting desired fixed frequencies.

Operating discs 9 are coupled to bars 8 of the push-buttons. By pressing one of the buttons a rotatable positioning member 10 is adjusted in its angular position in accordance with the relative position of these discs. By the movement of the tilting member the shaft 2 of the tuning member is rotated by means of gear wheels. A clutch 11 is provided between the tuning knob 1 and the shaft 2. One disc 12 of this clutch 11 is rigidly connected to the shaft 2 while the other disc 13 of the clutch is loosely mounted on the shaft 2 but rigidly fastened to the bevel gear 14. The clutch is disengaged by means of a lever 15 acting with a projection upon a flange connected to the clutch disc 13 and moving it in the direction of the shaft 2. The lever 15 is brought into the position of engagement by means of a spring 16 whereby the two discs 12 and 13 of the clutch are engaged and the tuning member may be actuated by the tuning knob 1. It is assumed that all push-buttons are in their normal position of rest as shown for button 4. This normal position is brought about under the influence of a coil spring 17. If one of the buttons, for instance button 3, is pressed the bar 8 engages a cam 18 of the lever 15 and moves it to the right as seen in the figure whereby the clutch 11 is disengaged. When the button is pressed in further the operating disc 9 turns the positioning member 10 in accordance with the respective set position of the operating disc so that also the shaft 2 is rotated which is connected to the tuning member. The tuning member is thus adjusted to a new frequency. The wave range switch is actuated simultaneously with this adjustment. Let it be assumed that the keys 4, 5 and 6 are provided for fixed frequencies of the medium wave range, while the key 3 would represent e. g. a fixed frequency of the long wave range, and the key 7 a fixed frequency of the short or ultra short wave range. The wave range switch comprises a movable frame 19 adjustable in three different fixed positions. The frame carries contacts cooperating with contacts L, M and K in order to actuate the corresponding long, medium or short wave range. In order to shift the frame 19 into the corresponding position by means of the respective push-button, cam segments 20 are pivotally mounted on the frame 19. The segments 20 carry projections 21 on the back side engaging slots of a stationary frame 22. When one of the push-buttons is pressed, the end of the bar 8 engages one of the sides of the cam segments 20 in accordance with the position of the frame 19 and moves the frame into one of its three operating positions. The cam segments have such a form that the push-buttons 3 and 7 move the frame 19 into its outer end positions while the push-buttons 4, 5 and 6 bring the frame into its central position. When the frame 19 is in its central position a pressure on one of the buttons 4, 5 and 6 does not change this position as the end of the bar 8 slides then between two cam segments 20 without moving one of them.

The problem solved by the invention is the re-tuning of the frequencies to be tuned with the keys. For this purpose the operating members 9 secured to the bars 8 are connected disengageably to the bars 8. The disengagement is effected by pulling out one key, as shown in the drawing for key 5. By pulling out the key out of its normal position, a spring 23 is released which when under tension couples the operating disc with bar 8. When key 5 is pulled, operating disc 9 is movable freely on bar 8. When a new fixed wavelength is now set by means of knob 1 and key 5 is thereafter pushed to abutment, the operating disc will engage the positioning member 10 adjusted by knob 1, and by a further pressure spring 23 will again be pressed against operating disc 9, whereby it will be again coupled to bar 8. Thereby the new wavelength is tuned for this key.

The advantage of the tuning structure of the invention is its very simple operation. In the normal position of rest of all push-buttons, i. e. in the position of button 4, any desired transmitter may be tuned in by the rotatable button 1. For selecting the corresponding wave range it is only necessary to press one of the buttons 3, 4—6 or 7 in order to switch in either the long, medium or short wave range.

When a quick selection of a fixed frequency is desired in any of the wave range it suffices to press one of the corresponding buttons. When a new fixed frequency shall be set to one of the buttons, this button which shall be set to a new frequency is pulled out, then the tuning member is tuned to the desired frequency by means of the tuning knob 1 for continuous tuning and the push-button is puhesd in up to the end whereby simultaneously the positioning member is set to the new fixed frequency and the wave range is selected. All these operations are carried out by moving the push-button in one direction only.

Although the tuning structure has been described in connection with an automobile receiver it may be used as well for setting of fixed frequencies in a transmitter. The invention is not limited to the use of push-buttons because it is possible to employ in the same manner keys similar to piano keys. The frequency is selected by pressing down the key while a lifting up the key releases the operating disc from the bar 8 in a corresponding manner.

We claim:

In a tuning structure for radio frequency apparatus having a plurality of ranges in combination a tuning member, a tuning knob for continuously tuning said tuning member, a clutch between said tuning knob and the shaft of said tuning member, a push button mechanism for selecting desired fixed frequencies, each push button actuating a bar on which said push button is mounted, said bar being operable by said push button axially of the push button, a stationary frame wherein said bars are guided, a movable frame for actuating said wave range switch, a positioning member connected by means of a gear to the tuning member, means for disengaging said clutch at depression of any one of said push buttons, means for subsequent positioning of said positioning member to a position corresponding to the desired position of said tuning member, cam segments pivotally mounted in said movable frame, said cam segments having projections engaging slots provided in said stationary frame, each said bar engaging with its end one of the sides of a corresponding said cam segment at depression of the respective button, whereby said tuning member and said wave range switch will be brought into its desired position by one single depression of a respective push button.

References Cited in the file of this patent

UNITED STATES PATENTS

| | | |
|---|---|---|
| 1,120,091 | Schmidt | Dec. 8, 1914 |
| 2,021,126 | Austin | Nov. 19, 1935 |
| 2,232,217 | Dijksterhuis et al. | Feb. 8, 1941 |
| 2,266,711 | Crosby et al. | Dec. 16, 1941 |
| 2,312,239 | DeJong | Feb. 23, 1942 |
| 2,356,935 | Koch | Aug. 29, 1944 |
| 2,367,860 | Gersch | Jan. 23, 1945 |
| 2,596,451 | Wagenknecht | May 13, 1952 |